United States Patent
Hiller

(10) Patent No.: US 9,728,702 B1
(45) Date of Patent: Aug. 8, 2017

(54) POWER DELIVERY THROUGH A BARRIER

(75) Inventor: Nathan D. Hiller, Irvine, CA (US)

(73) Assignee: The Boeing Company, Chicago, IL (US)

( * ) Notice: Subject to any disclaimer, the term of this patent is extended or adjusted under 35 U.S.C. 154(b) by 821 days.

(21) Appl. No.: 13/596,639

(22) Filed: Aug. 28, 2012

(51) Int. Cl.
 *H01L 35/32* (2006.01)
 *H01L 35/34* (2006.01)

(52) U.S. Cl.
 CPC .............. *H01L 35/32* (2013.01); *H01L 35/34* (2013.01)

(58) Field of Classification Search
 CPC ....... H01L 35/325; H01L 35/32; H01L 35/30; H01L 35/28
 USPC ................................. 136/225, 228, 230–233
 See application file for complete search history.

(56) References Cited

U.S. PATENT DOCUMENTS

| | | | |
|---|---|---|---|
| 6,492,585 B1 * | 12/2002 | Zamboni et al. | 136/201 |
| 6,914,343 B2 | 7/2005 | Hiller et al. | |
| 7,012,554 B2 | 3/2006 | Hiller et al. | |
| 7,649,138 B2 | 1/2010 | Hiller et al. | |
| 2008/0135081 A1 * | 6/2008 | Sharifi et al. | 136/207 |

OTHER PUBLICATIONS

"Thermoelectric effect," http://en.wikipedia.org/wiki/Thermoelectric_effect (2004).

Graham, D. et al., "Investigation of Methods for Data Communication and Power Delivery Through Metals," IEEE Trans. on Industrial Electronics, vol. 58, No. 10, pp. 4972-4980 (2011).

Jovanovic, V., "Alternative Methods of Wireless Sensor Power," SBIR 2005, Navy, Contract # N052-130-0459, retrieved at http://www.sbir.gov/sbirsearch/detail/181248 (2005).

Kushch, A., "Thermoelectric Power Generation and Management Module," SBIR 2007, Contract #N062-140-0180, retrieved at http://www.sbir.gov/sbirsearch/detail/181262 (2007).

Nowacki, K., "The sound velocity in an alloy steel at high temperature conditions," Int. J. Thermophysics, vol. 31, No. 1, pp. 103-112 (Jan. 2010).

(Continued)

*Primary Examiner* — Matthew Martin
*Assistant Examiner* — Dujuan Horton
(74) *Attorney, Agent, or Firm* — Thompson Hine LLP

(57) ABSTRACT

A system and method for power delivery through a barrier may include a source for directing thermal energy through a first side of a barrier of sufficient intensity to raise the temperature of at least a region of the barrier and propagate therethrough to a second side thereof, and a thermoelectric generator positioned adjacent the second side of the barrier proximate the region to receive the thermal energy from the source and convert the thermal energy into electricity. A method for delivering power through a barrier may include directing thermal energy upon a first side of a barrier, the thermal energy being of sufficient intensity to raise a temperature of at least a region of the barrier and propagate therethrough to a second side thereof, receiving the thermal energy from the source through the barrier adjacent the second side, and converting the thermal energy to electricity adjacent the second side.

23 Claims, 1 Drawing Sheet

(56) References Cited

OTHER PUBLICATIONS

Sherrit, S. et al., "Studies of Acoustic-Electric Feed-throughs for Power Transmission Through Structures," Smart Structures and Materials Symposium, San Diego, California, retrieved at http://trs-new.ipl.nasa.gov/dspace/handle/2014/38890 (Feb. 27, 2006).

Shoudy, D. et al., "P3F-5 an ultrasonic through-wall communication system with power harvesting," Proc. IEEE Ultrason. Symp., pp. 1848-1853 (Oct. 2007).

* cited by examiner

POWER DELIVERY THROUGH A BARRIER

BACKGROUND

The disclosure relates to methods and systems for power transmission and, more particularly, to methods and systems in which thermal energy is conveyed through a barrier and converted to electricity.

It is often necessary to power an electronic component, such as a sensor, in an environment that is not readily accessible to electric power. An example of such an environment may be found on naval vessels, which may require multiple sensors to monitor systems and processes to improve efficiency, reliability and safety. Although sensor communications may be transmitted wirelessly, providing electric power to such sensors typically requires wires. Running wires to such sensors often may require penetration of steel walls that may be as thick as 20 mm. Drilling holes in such walls or bulkheads may be unacceptable because it may compromise the structural integrity of the wall or bulkhead.

Another application in which sensor access to electrical power may be difficult is in an aircraft or space vehicle, which may require airtight barriers between pressurized compartments and the ambient. While it is known to provide gaskets and other devices that enable electric wires to penetrate a barrier or bulkhead, such gaskets and devices may be subject to degradation in integrity over time, which may result in leakage.

A further application in which a sensor or other electrically powered device may be placed in an environment in which it is difficult to access electrical power is in a sealed chamber that may contain a dangerous or toxic substance, such as a virus, radioactive material or chemical agents, or conversely, a clean room that is sealed from the ambient. Again, it is desirable to provide the sealed chamber with walls enclosing such materials that minimize the number of openings for passage of electrical wires to power sensors and other electrical components, thereby minimizing the likelihood of breaching the sealed chamber enclosure and leakage of the contents of the chamber to the ambient, or conversely, leakage of the ambient into the chamber.

Accordingly, there is a need to provide a system and method for delivery of power for an electrical component that may be transmitted through a barrier without the necessity of passing electrical wires, conduits and other conventional mechanisms for conveying electricity through the barrier.

SUMMARY

The disclosure is directed to a method and system for delivering power through a barrier that does not require the barrier to be breached in order to pass electric cables, conduits, wires or other means for conducting electricity to power an electrical component on the other side of the barrier, and facilitates the movement and placement of an electrical component. In one embodiment, a system for power delivery through a barrier may include a source for directing thermal energy upon a first side of the barrier of sufficient intensity to raise a temperature of at least a region of the barrier and propagate through the barrier to a second side thereof, and a thermal electric generator positioned adjacent the second side of the barrier sufficiently proximate the region to receive the thermal energy from the source and convert the thermal energy to electricity. In another embodiment, a system for power delivery may include a barrier made of a material capable of transmitting thermal energy from a first side to a second side, a source for directing thermal energy upon the first side of the barrier of sufficient intensity to raise a temperature of at least a region of the barrier and propagate through the barrier to the second side thereof, and a thermoelectric generator positioned adjacent the second side of the barrier sufficiently proximate the region to receive the thermal energy from the source and convert the thermal energy to electricity.

The disclosure is also directed to a method for delivering power through a barrier that may include directing thermal energy upon a first side of a barrier, the thermal energy being of sufficient intensity to raise a temperature of at least a region of the barrier and propagate through the barrier to a second side thereof, receiving the thermal energy from the source through the barrier adjacent the second side, and converting the thermal energy to electricity adjacent the second side. In another embodiment, a method for delivering power through a barrier may include providing a first thermoelectric generator adjacent a first side of the barrier and actuating the first thermoelectric generator to direct thermal energy upon the first side of sufficient intensity to raise a temperature of at least a region of the barrier and propagate through the barrier to a second side thereof, and providing a second thermoelectric generator adjacent the second side and actuating the second thermoelectric barrier to receive the thermal energy from the first thermoelectric generator through the barrier and convert the thermal energy to electricity. In yet another embodiment, a method for delivering power through a barrier may include causing thermal energy of sufficient intensity to raise a temperature of at least a region of the barrier to propagate at least partially through the barrier to a side thereof, receiving the thermal energy through the barrier adjacent the side, and converting the thermal energy to electricity.

Other objects and advantages of the disclosed method and system will be apparent from the following description, the accompanying drawings and the appended claims.

DETAILED DESCRIPTION

Figure 1:
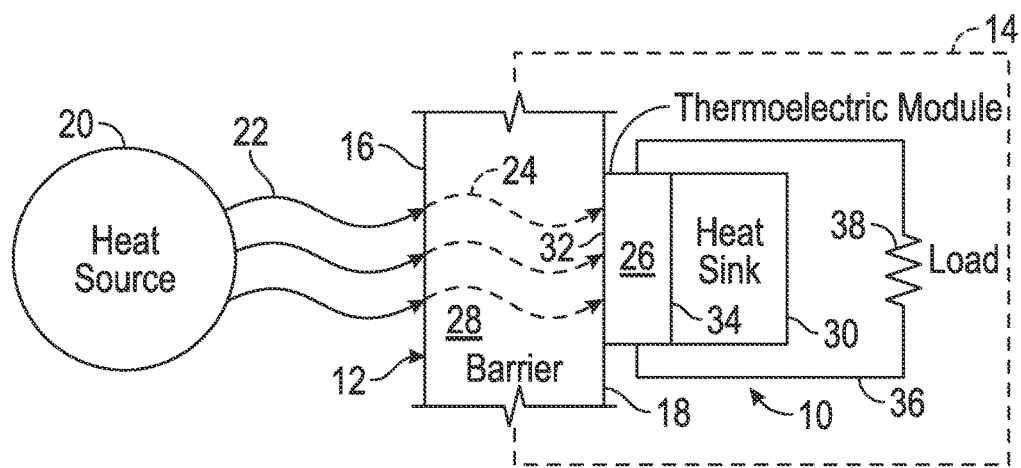
FIG. 1 is a schematic diagram showing the disclosed system and method for power delivery through a barrier.

As shown in FIG. 1, the system for power delivery through a barrier, generally designated 10, is shown positioned adjacent a barrier, generally designated 12. The barrier 12 may be a wall, bulkhead, plate, or other structure. Further, the barrier 12 may be part of an enclosure 14, such as a clean room or other hermetically sealed chamber. In an embodiment, the system 10 is adjacent a barrier 12 that is capable of transmitting or conducting thermal energy. Examples of such barrier materials may include steel, aluminum, and other metals, as well as carbon fiber, glass, and the like. In an embodiment, the barrier 12 may be provided as a continuous, imperforate sheet or plate; that is, a sheet or plate without any type of opening, hole, passageway or conduit from a first side 16 of the barrier to a second, opposite side 18 of the barrier. In embodiments, the barrier 12 may be part of a wall, bulkhead, window (in which it may be made of transparent material such as glass), or a partition.

In an embodiment, the system 10 may include a heat source 20. The heat source may be positioned adjacent the first side 16 of the barrier 12 and generates thermal energy, indicated at 22, that impacts the first side 16 of the barrier 12. The thermal energy 22 is conducted through the barrier 12, as indicated at 24, to the second side 18. In an embodiment, the thermal energy 22 generated by the heat source 20 is less than what would permanently affect the barrier 12. For example, the thermal energy 22 would be less than would deform or melt a barrier 12 made of metal or glass. The system 10 also may include a thermoelectric generator 26 positioned adjacent the second side 18 of the barrier 12. In an embodiment, the thermoelectric generator 26 may be mounted on the second side 18 of the barrier 12 in a region 28 in which the intensity of the thermal energy 24 traveling through the barrier is greatest. The thermoelectric generator 26 may include a heat sink 30.

The thermoelectric generator 26 may be a thermoelectric module, such as a solid state thermoelectric module. Examples of such thermoelectric modules are manufactured by Laird Technologies (www.lairdtech.com) and Marlow Industries, Inc. (www.marlow.com). Thermoelectric generators 26 that may be used may include a multistage (cascade) thermoelectric module, a ceramic plate thermoelectric module, a thin film thermoelectric module, and others. Such thermoelectric modules 26 may operate by "pumping" heat from one (typically ceramic) face to the other (typically ceramic) face when a direct current is applied. Conversely, when one face of the thermoelectric module is heated relative to the other face, direct current (power) is generated. Such thermoelectric modules may utilize the Seebeck effect to convert a temperature differential to a direct current.

In the embodiment shown in FIG. 1, a "hot" side 32 of the thermoelectric generator 26 may be positioned adjacent the second side 18 of the barrier 12, and in an embodiment may be physically attached to the second side, as by appropriate adhesives or mechanical attachments such as screws or brackets (not shown). The "cold" side 34 of the thermoelectric generator 26 may be positioned away from the second side 18 and contacts the heat sink 30. Consequently, when thermal energy 24 traverses the barrier 12, it heats the hot side 32 of the thermoelectric module 26 to a temperature greater than the cold side 34, which results in the creation of an electric current.

As shown in FIG. 1, the electric current created by the thermoelectric generator 26 may travel through an electric circuit 36 to a load, generally designated 38. In an embodiment, the load 38 may be a sensor or other component that requires electricity to operate. In embodiments, the load 38 may be a sensor, clock, display, alarm, or transducer.

Figure 2:
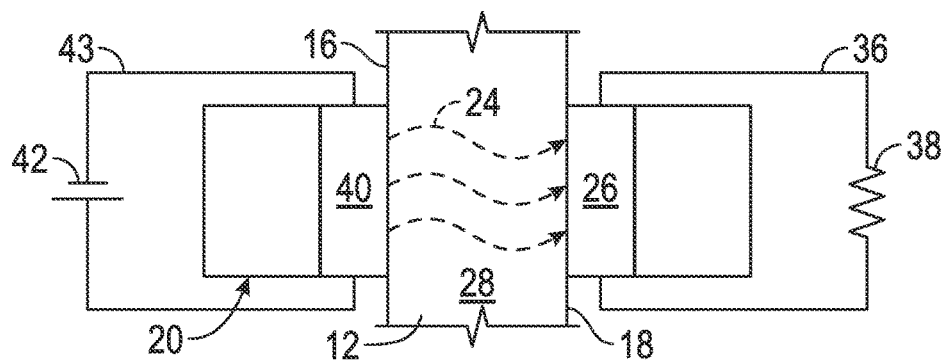
FIG. 2 is an embodiment of the method and system shown in FIG. 1, utilizing a thermoelectric generator as a heat source.

As shown in FIG. 2, in an embodiment, the heat source 20 may be a second thermoelectric generator 40 that is actuated by a source of direct current 42 provided over a circuit 43. In an embodiment, the second thermoelectric generator 40 may be of the same design, type or size as the thermoelectric generator 26, or it may be of a different design, type or size. In an embodiment, one or both thermoelectric generators 26, 40 are thermoelectric modules.

In other embodiments, the heat source 20 may be an electric resistance coil, hot water or other heated fluid flowing through a pipe or pipes in the barrier 12, a source of flame, such as a gas burner, directed against the barrier, a device for heating the barrier 12 by induction, and a device for heating the barrier 12 by other means, such as by directing infrared radiation on the first surface 16 adjacent the region 28. With each of the aforementioned devices and methods, the result is that thermal energy 24 may be directed through the barrier 12 in the region 28, a fraction of which may be absorbed by the thermoelectric module 26, where it is converted to electricity that travels through circuit 36 to power load 38.

Figure 3:
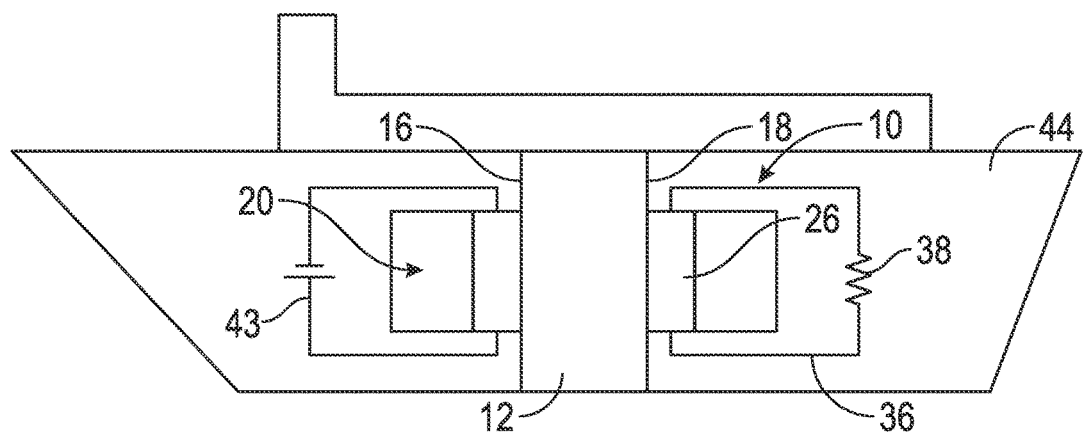
FIG. 3 is schematic depiction of the system and method for power delivery through a barrier, shown mounted in a naval vessel.

As shown in FIG. 3, in an embodiment, the system 10 may be incorporated in a vehicle 44. The barrier 12 may be a bulkhead or other wall within the vehicle 44. The vehicle 44 may be a naval vessel, such as a surface ship, depicted schematically in FIG. 3, or a submarine, either manned or unmanned. In other embodiments, the vehicle 44 may comprise an aircraft or spacecraft (manned or unmanned), or a tank or other armored vehicle (manned or unmanned). As shown in FIG. 3, the thermoelectric generator 26 may be mounted on the second side 18 of the barrier 12. The heat source 20, which may be a second thermoelectric generator 40 (FIG. 2), may be mounted on the first side 16 of the barrier 12.

As shown best in FIG. 2, for the embodiment of FIG. 3, and other embodiments disclosed herein, activation of the heat source 20 causes the heat source to generate thermal energy 22 that impinges the first side 16 of the barrier 12. In other embodiments, the heat source 20 may be mounted on the first surface 16 of the barrier 12 (either directly or by way of a solid thermal energy conductor (not shown)), or embedded in the barrier 12, so that thermal energy 22 would not propagate across a space or void from source 20 to barrier 12. The thermal energy 22 propagates as thermal energy 24 through the barrier 12 and heats the thermoelectric generator 26, causing it to generate electric current in circuit 36 that is conducted to and powers the load 38.

The system and method described eliminates the need to compromise structural members in order pass through electrical conductors to power electrical devices such as sensors. While the forms of apparatus and methods described herein constitute preferred embodiments of the invention, other systems and methods may be employed without departing from the scope of the invention.

What is claimed is:

1. A system for power delivery through a barrier, the system comprising:
   a second thermoelectric generator for directing thermal energy upon a first side of the barrier with sufficient intensity to raise a temperature of at least a region of the barrier and propagate through the barrier to a second side thereof; and
   a thermoelectric generator having a hot side and a cool side, wherein the hot side of the thermoelectric generator is positioned adjacent the second side of the barrier sufficiently proximate the region to receive the thermal energy from the second thermoelectric generator and heat the hot side of the generator such that the thermoelectric generator converts the thermal energy to electricity.

2. The system of claim 1, wherein the second thermoelectric generator includes a source of electricity.

3. The system of claim 1, wherein the thermoelectric generator is a solid-state thermoelectric module.

4. The system of claim 1, wherein the second thermoelectric generator is a solid-state thermoelectric module.

5. The system of claim 1, further comprising a load electrically connected to and powered by the thermoelectric generator.

6. The system of claim 5, wherein the load is a device that uses electrical energy provided by the thermoelectric generator.

7. The system of claim 6, wherein the device is one of a sensor, a clock, and a display.

8. The system of claim 1, wherein raising the temperature of the at least a region of the barrier does not permanently affect the barrier.

9. The system of claim 1, wherein the barrier is positioned adjacent the thermoelectric generator, the barrier having the first side and the second side and made of a material that conducts thermal energy.

10. The system of claim 9, wherein the barrier is incorporated into a vehicle.

11. The system of claim 10, wherein the vehicle is one of a naval vessel, aircraft, spacecraft, and armored vehicle.

12. The system of claim 9, wherein the generator is mounted on the second side of the barrier.

13. The system of claim 9, wherein the thermoelectric generator is a thermoelectric module.

14. The system of claim 9, wherein the barrier is one of a wall, a bulkhead, a window, and a partition.

15. The system of claim 9, wherein the barrier is imperforate in at least the region.

16. The system of claim 9, wherein the barrier is a wall, and wherein the wall is part of an enclosed chamber.

17. A method for delivering power through a barrier, the method comprising:
   directing thermal energy upon a first side of a barrier, the thermal energy being of sufficient intensity to raise a temperature of at least a region of the barrier and propagate through the barrier to a second side thereof;
   receiving the thermal energy through the barrier adjacent the second side; and
   converting the thermal energy to electricity by a thermoelectric generator having a hot side and a cool side, wherein the hot side of the thermoelectric generator is positioned adjacent the second side of the barrier sufficiently proximate the region to receive the thermal energy and heat the hot side of the generator such that the thermoelectric generator converts the thermal energy to electricity.

18. The method of claim 17, wherein the step of directing thermal energy includes operating a second thermoelectric generator adjacent the first side of the barrier.

19. The method of claim 17, wherein the step of directing thermal energy includes raising a temperature of the region of the barrier above an ambient temperature of the region adjacent the second side of the barrier.

20. The method of claim 17, further comprising mounting the thermoelectric generator on the second side.

21. The method of claim 17, further comprising providing a load electrically connected to and powered by the thermoelectric generator.

22. A method for delivering power through a barrier, the method comprising:
   providing a first thermoelectric generator adjacent a first side of the barrier and actuating the first thermoelectric generator to direct thermal energy upon the first side of sufficient intensity to raise a temperature of at least a region of the barrier and propagate through the barrier to a second side thereof; and
   providing a second thermoelectric generator adjacent the second side and actuating the second thermoelectric generator to receive the thermal energy from the first thermal electric generator through the barrier and convert the thermal energy to electricity, the second thermoelectric generator having a hot side and a cool side, wherein the hot side of the second thermoelectric generator is positioned adjacent the second side of the barrier sufficiently proximate the region to receive the thermal energy from the first thermoelectric generator and heat the hot side of the second thermoelectric generator such that the second thermoelectric generator converts the thermal energy to electricity.

23. A method for delivering power through a barrier, the method comprising:
   causing thermal energy of sufficient intensity to raise a temperature of at least a region of the barrier to propagate at least partially through the barrier to a side thereof;
   receiving the thermal energy through the barrier adjacent the side; and
   converting the thermal energy to electricity by a thermoelectric generator having a hot side and a cool side, wherein the hot side of the thermoelectric generator is positioned adjacent the side of the barrier sufficiently proximate the region to receive the thermal energy and heat the hot side of the thermoelectric generator such that the thermoelectric generator converts the thermal energy to electricity.

* * * * *